United States Patent
Padilla et al.

(10) Patent No.: US 12,342,508 B2
(45) Date of Patent: Jun. 24, 2025

(54) CONTINUOUS FEED LIQUID COOLANT REPLACEMENT

(71) Applicant: Google LLC, Mountain View, CA (US)

(72) Inventors: Jorge Padilla, Union City, CA (US); Reza Khiabani, San Mateo, CA (US); Madhusudan Krishnan Iyengar, Foster City, CA (US)

(73) Assignee: Google LLC, Mountain View, CA (US)

( * ) Notice: Subject to any disclaimer, the term of this patent is extended or adjusted under 35 U.S.C. 154(b) by 327 days.

(21) Appl. No.: 18/047,207

(22) Filed: Oct. 17, 2022

(65) Prior Publication Data
US 2024/0057297 A1    Feb. 15, 2024

(51) Int. Cl.
*H05K 7/20* (2006.01)

(52) U.S. Cl.
CPC ....... *H05K 7/2079* (2013.01); *H05K 7/20218* (2013.01); *H05K 7/20272* (2013.01); *H05K 7/20281* (2013.01); *H05K 7/20763* (2013.01)

(58) Field of Classification Search
CPC ............ H05K 7/2079; H05K 7/20781; H05K 7/20218; H05K 7/20272; H05K 7/20281; H05K 7/20763; F25B 2345/001; F25B 2345/002; F25B 2345/003; F25B 2600/05
See application file for complete search history.

(56) References Cited

U.S. PATENT DOCUMENTS

| | | | |
|---|---|---|---|
| 2017/0223871 A1* | 8/2017 | Sylvestre | ................ H01L 23/34 |
| 2017/0239741 A1 | 8/2017 | Furuta | |
| 2022/0117119 A1 | 4/2022 | Heydari | |
| 2022/0248570 A1 | 8/2022 | Chen et al. | |

FOREIGN PATENT DOCUMENTS

WO    WO 2021123581    6/2021

OTHER PUBLICATIONS

Extended European Search Report in European Appln. No. 23175137.1, mailed on Mar. 15, 2024, 10 pages.

* cited by examiner

*Primary Examiner* — Joseph F Trpisovsky
(74) *Attorney, Agent, or Firm* — Fish & Richardson P.C.

(57) ABSTRACT

Methods, systems, and apparatus for liquid coolant replacement in a cooling distribution unit during operation of the cooling distribution unit. Active liquid coolant to be replaced is removed from the flow cycle of the cooling distribution unit while the coolant distribution unit is operational and providing cooling to an electronic system. Additionally, replacement liquid coolant is provided to the flow cycle while the coolant distribution unit is operational and providing cooling to an electronic system.

17 Claims, 6 Drawing Sheets

CONTINUOUS FEED LIQUID COOLANT REPLACEMENT

BACKGROUND

This specification relates to liquid coolant systems.

Liquid cooling systems are often used to cool electronic equipment, and are often used in datacenters. A liquid cooling system usually includes a coolant distribution unit (CDU), which provides chilled coolant to various heat exchangers in the equipment being cooled, and receives the warmed coolant after the coolant has been heated by the heat exchangers. The warmed coolant is then chilled by a chilling process, and the chilled coolant is then recirculated. Typically, the liquid coolant flows in a closed-loop path referred to as a flow cycle.

A variety of liquids can be used as liquid coolant. These liquids include water, water/glycol mixes, and other liquids. The type of liquid used may depend on the specification requirements of the system to be cooled, the type of cooling system used, and the like.

Regardless of the type of liquid used, each of these cooling systems requires maintenance of the liquid coolant. Over time, the coolant will become contaminated with one or more of oxides, scaling and corrosion particles, biologics, and the like. As the contaminants build up, the coolant quality decreases. This results in increased corrosion of the cooling system (pipes, cold plates, etc.), and decreased cooling efficiency.

To maintain the coolant, the cooling system is periodically shut down while coolant is replaced. Because the electronic devices being cooled will overheat without cooling, the electronic devices are also shut down while the coolant is replaced. This leads to loss of computing resources and customer downtime.

SUMMARY

This specification describes technologies relating to a continuous feed liquid coolant replacement system that replaces liquid coolant while the cooling system is operational. In general, one innovative aspect of the subject matter described in this specification can be embodied in a liquid coolant replacement system, comprising: a first reservoir for storing replacement liquid coolant, the replacement liquid coolant being liquid coolant that is to replace active liquid coolant in a coolant distribution unit of a coolant system; a liquid coupling subsystem through which the replacement liquid coolant is provided into a flow cycle of the active liquid coolant in the coolant distribution unit, and through which the active liquid coolant is received from the flow cycle of the coolant distribution unit; a control system coupled to the liquid coupling subsystem and that generates control signals for the liquid coupling subsystem for a replacement operation that causes the liquid coupling subsystem to: receive, from the coolant distribution unit, active liquid coolant that is removed from the flow cycle while the coolant distribution unit is operational and providing cooling to an electronic system, and provide, from the first reservoir, replacement liquid coolant to the flow cycle while the coolant distribution unit is operational and providing cooling to an electronic system. Other embodiments of this aspect include corresponding methods, apparatus, and computer programs, configured to perform the actions of the methods, encoded on computer storage devices.

Particular embodiments of the subject matter described in this specification can be implemented so as to realize one or more of the following advantages. Because liquid coolant is replaced during the operation of the cooling system, periodic downtimes are reduced or even eliminated. This results in increased utilization of computer resources. Moreover, the automation of the coolant maintenance and replacement reduces support hours required by system maintenance personnel, which reduces overall operational costs. Because coolant is maintained at a minimum quality level, there is less likelihood of system degradation (corrosion, loss of cooling capability, etc.) than when human interaction is required, as the latter may involve scheduling that may not always ensure that the coolant quality is maintained at at least a minimum quality level. Moreover, the reduction of human interaction also reduces spillage, dosing errors, and improper timing of changing coolant. Additionally, the system can also monitor its own supply of replacement coolant for quality and contamination, and thus the likelihood of introducing contaminated coolant into a cooling system is reduced.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
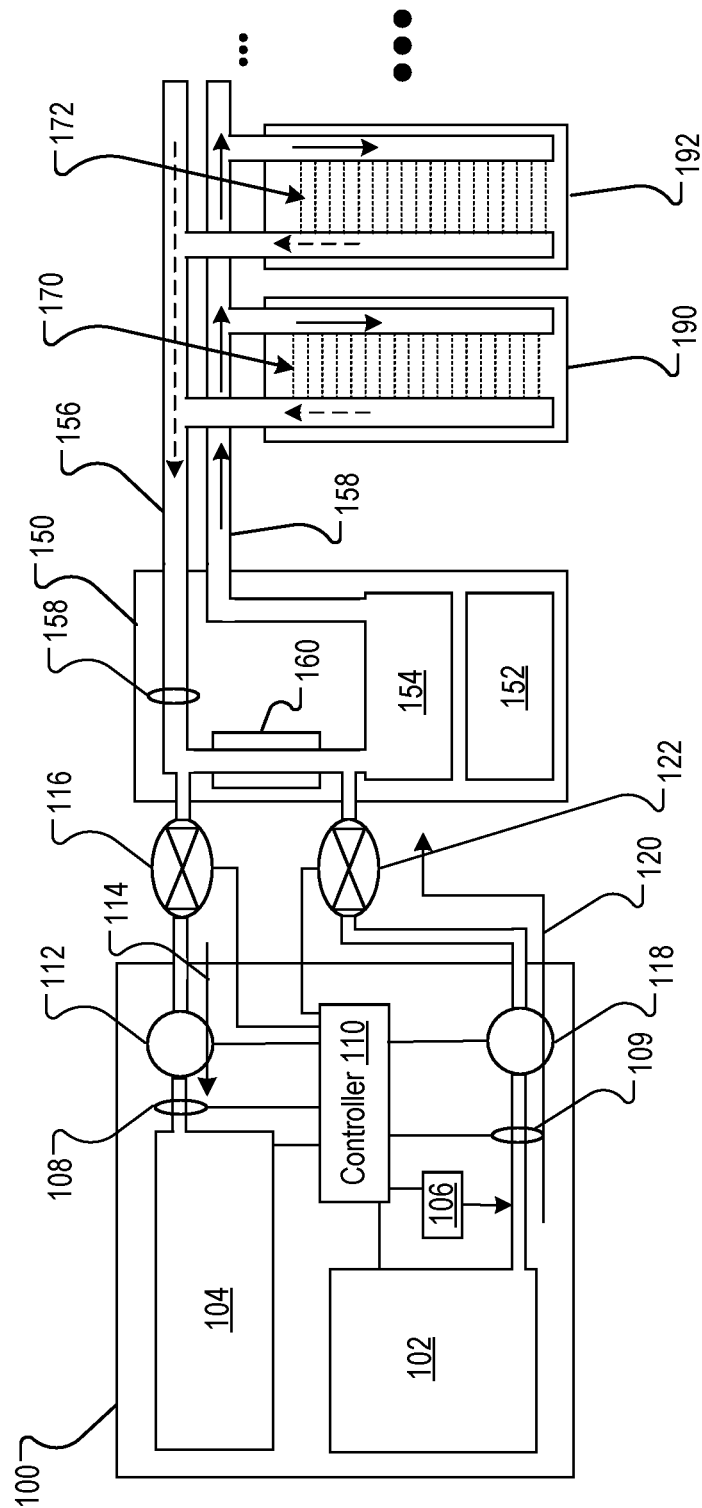
FIG. 1 is a block diagram of a liquid coolant replacement system.

FIG. 1 is a block diagram of a liquid coolant replacement system 100. The system 100 includes a reservoir 102 that stores replacement liquid coolant. The replacement liquid coolant is the coolant that is to replace active liquid coolant in the coolant distribution unit 150 of a coolant system. During a replacement operation, liquid coolant that is being replaced, which is referred to as the "active liquid coolant" or "active coolant," is received and stored in another reservoir 104. The coolant that is provided to the coolant distribution unit 150 is referred to as the "replacement liquid coolant" or "replacement coolant." The replacement coolant is provided to the coolant distribution unit 150 while the coolant distribution unit 150 is operational and providing cooling to an electronic system, such as servers 190 and 192.

In the system 100 of FIG. 1, the replacement coolant is provided to the coolant distribution unit 150 while the active coolant is being removed from the coolant distribution unit 150 and while the coolant distribution unit 150 remains operational. A liquid coupling subsystem that includes pumps 112 and 118 and valves 116 and 122 is used to provide the replacement liquid coolant into a flow cycle of the active liquid coolant in the coolant distribution unit 150, and also to remove the active liquid coolant from the flow cycle of the coolant distribution unit 150. In particular, a first physical flow path 114 through the valve 116 and the pump 112 receives active liquid coolant from the flow cycle, and a second physical flow path 120 through the pump 118 and valve 122 provides replacement liquid coolant to the flow cycle from the first reservoir 102. As depicted in FIG. 1, the flow path 114 exits the coolant distribution unit 150 at a separate location from where the flow path 120 enters the coolant distribution unit, which allows for simultaneous extraction of active coolant and addition of replacement coolant.

The controller 110 is a control system that generates control signals that operate the valves 116 and 122, and the pumps 112 and 118, to cause the first physical flow path 114 to receive active liquid coolant and the second physical flow path 120 to provide replacement liquid coolant simultaneously and at a substantially equal flow rates during a replacement operation.

The coolant distribution unit 150 can be part of a larger cooling system. The coolant distribution unit 150 includes a control system 152 that operates the unit 150. Active coolant circulates in the flow cycle as indicated by the dashed return arrow in pipe 156 and the solid supply arrow in pipe 158. The pipe 156 returns warmed active coolant, and the pipe 158 provides chilled active coolant. Heat exchangers 170 and 172 circulate the active coolant in servers 190 and 192 to provide cooling to the servers 190 and 192.

A chiller 160 chills the active coolant, and an optional reservoir 154 stores a reserve of active coolant. The chiller may be part of a larger chilling system, which is not shown.

The system 100 may include a sensor 108, or, optionally, may receive data from a sensor 158 in the coolant distribution unit 150. The sensor 108 or 158 may be a coolant quality sensor subsystem with a single sensor that senses that for a particular quality characteristic, or may be a subsystem with multiple sensors that each sense for particular quality characteristics. The sensor 108 or 158 generates data that indicates the quality of the active liquid coolant. Example sensors include an optical sensor that determines coolant quality based on an optical characteristic of the coolant (e.g., a turbidity sensor), a pH level sensor, a biologic sensor, a conductivity sensor, particulate sensor, or any other appropriate sensor that senses a particular characteristic of the liquid coolant to determine a coolant quality.

Another sensor 109 may also be used to monitor the quality of the replacement liquid coolant in the reservoir 102. This can be done to ensure that the replacement liquid coolant is not contaminated or otherwise unsuitable for use in a replacement operation. If the controller 110 determines, from the sensor 109, that the replacement liquid coolant is below a threshold quality level, then the system 100 will notify an administrator that coolant service is required.

During a replacement operation, the controller 110 operates the valves 116 and 122 and the pumps 112 and 118 to replace active coolant with replacement coolant. The replacement operation can be done on a periodic basis, e.g., every week, and during the replacement operation only a portion of the active coolant is replaced with replacement coolant. In some implementations, the portion can be a predetermined amount of liquid coolant that is less than an amount of active liquid coolant in the coolant distribution unit 150 before the replacement operation. For example, if there are 100 liters of active liquid coolant in the flow cycle, then the periodic replacement operation may replace 10 liters of active liquid coolant with replacement liquid coolant.

In other implementations, the replacement operation may be triggered based on the determined quality level of the active liquid coolant. For example, if the quality level is determined by the controller, based on sensor data, to be below a first threshold quality level, e.g., a minimum threshold, then the replacement operation is initiated and the predetermined amount of active liquid coolant is replaced with the replacement liquid coolant.

In variations of this implementation, during the replacement operation, the coolant quality sensor subsystem 108 or 158 periodically determines an updated quality level of the active liquid coolant and generates data indicating the determined updated quality of the active liquid coolant. The controller 110 receives, from the coolant quality sensor subsystem 108 or 158, the data indicating the determined updated quality of the active liquid coolant. When the determined updated quality of the active liquid coolant exceeds the first threshold quality level, the controller 110 ceases the replacement operation. In some implementations, the quality level of the active liquid coolant must exceed a second threshold quality level that is greater than the first threshold quality level before the replacement operation ceases. This ensures that active liquid coolant in the flow cycle is refreshed to a level that is above the minimum quality level by some threshold amount. For example, assume the turbidity quality measure is on a scale of 0 to 1, with 0 being completely opaque and 1 being clear. The first threshold quality level may be 0.9, and the second threshold quality level may be 0.96. Thus, when enough replacement liquid coolant has been added to the flow cycle and a corresponding amount of active liquid coolant has been removed to result in the turbidity level being at 0.96 or higher, the replacement operation ceases.

In some implementations, the system 100 may include a reservoir that stores a chemical agent that is added to the replacement liquid coolant provided to the flow cycle during the replacement operation. While only one reservoir is shown, there may be multiple reservoirs, each with a corresponding agent that each accomplishes a particular remediation. The amount of agent that is added can be based on the quality level of the active liquid coolant. For example, a biocide may be added when bacteria or fungi is detected; a neutralizer may be added to restore a pH level to within a certain range; and so on. The amount of each chemical agent to be added can be programmed into the controller 110 and based on the detected levels of a characteristic for which the agent is to mitigate. Thus, the controller 110 can regulate both the amount of active liquid coolant replaced, and the amount of chemical agent added. In other implementations, a fixed amount of agent may be added.

In some implementations, the flow rate of coolant replacement may also be adjusted based on the amount of coolant to be replaced, and/or based on the detected quality level. In some implementations, for the more coolant that is to be replaced, the controller 110 will increase the flow rate. This is done to reduce the time for the replacement operation, especially when the system 100 is a mobile system that can be used to service multiple closed loop cooling systems during a workday.

In another implementation, the system 100 can be configured to replace all the coolant in the flow cycle of the coolant distribution unit 150. This can be done, for example, when the active coolant is determined to be so contaminated that replacement of the entire coolant would be preferable, or as part of a periodic maintenance schedule, e.g., every six months. To accomplish this, the controller 110 is configured to generate another set of control signals to operate the pumps and valves to accomplish the replacement of the active liquid coolant with the replacement liquid coolant.

The system 100 of FIG. 1 has two separate physical paths for coolant exchange, which enables the simultaneous addition and extraction of coolant. In another implementation, such as that of FIG. 2, the system 100 may have a flow path portion that is a single physical flow path. The controller 110, for example, can operate a three-way valve 216 and pumps 112 and 118 accordingly so the flow path can selectively receive active liquid coolant from the flow cycle during a first selection, as indicated by arrow 214, and selectively provide replacement liquid coolant to the flow cycle during a second selection, as indicated by arrow 220. The controller 110 generates control signals that cause the single physical flow path to selectively receive active liquid coolant during a first time period and selectively provide replacement liquid coolant during a second time period. Typically, a volume of active liquid coolant is removed, and then an equal volume of replacement liquid coolant is added. This can be done incrementally, e.g., X liters can be removed and then X liters added until the predetermined amount of replacement coolant has been added.

The system 100 can be integrated into a larger cooling system, e.g., the system 100 can be a component of or subsystem within the cooling distribution unit 150. In other implementations, the system 100 can be a standalone device that can be temporarily attached to a cooling distribution unit 150. Moreover, while the system 100 is described as being in communication with the cooling distribution unit, it can be attached to any part of the piping in a flow cycle, and need not be connected with the cooling distribution unit.

Figure 2:
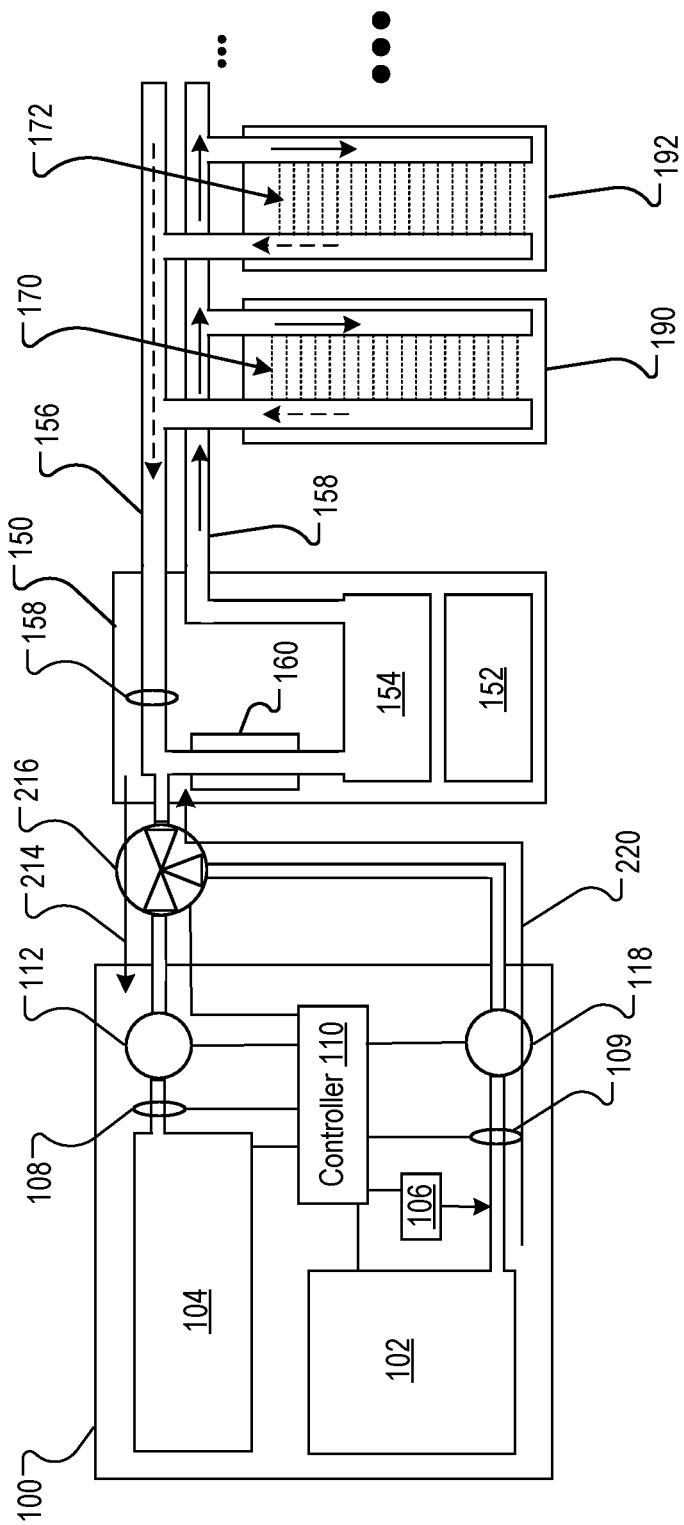
FIG. 2 is a block diagram of a variation of the liquid coolant replacement system of FIG. 1.
Figure 3:
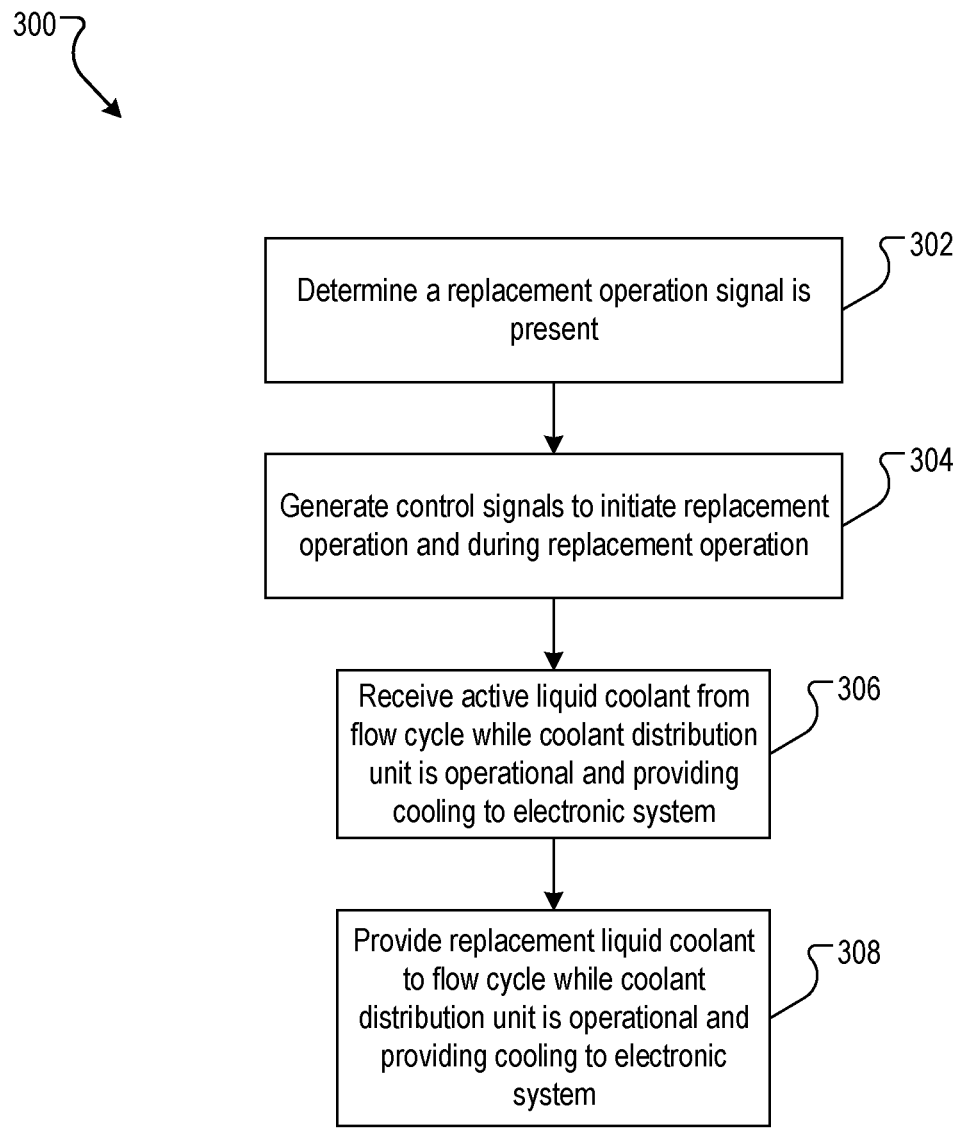
FIG. 3 is a flow diagram of an example process for replacing liquid coolant using the systems of either FIG. 1 or 2.

FIG. 3 is a flow diagram of an example process for replacing liquid coolant using the systems of either FIG. 1 or 2. The process can be implemented in the system of FIG. 1 or 2 by the controller 110.

The process 300 determines a replacement operation signal is present (302). As described above, the replacement operation signal can be generated in response to an expiration of a time period, e.g., a bi-weekly replacement operation; a low coolant level signal; or in response to a quality characteristic indicating a quality issue with the liquid coolant.

The process 300 generates control signals to initiate a replacement operation (304). As described above, the control signals operate the pumps and values to remove active coolant from the flow cycle and to add replacement coolant to the flow cycle. In particular, during the replacement operation, the system 100 receives active liquid coolant from the flow cycle while the coolant distribution unit is operational and provides cooling to the electronic system (306), and provides replacement liquid coolant to the flow cycle while the coolant distribution unit is operational and providing cooling to the electronic system (308). The addition and replacement of coolant can occur simultaneously, such as described with reference to FIG. 1, or can occur separately, as described with reference to FIG. 2.

Figure 4:
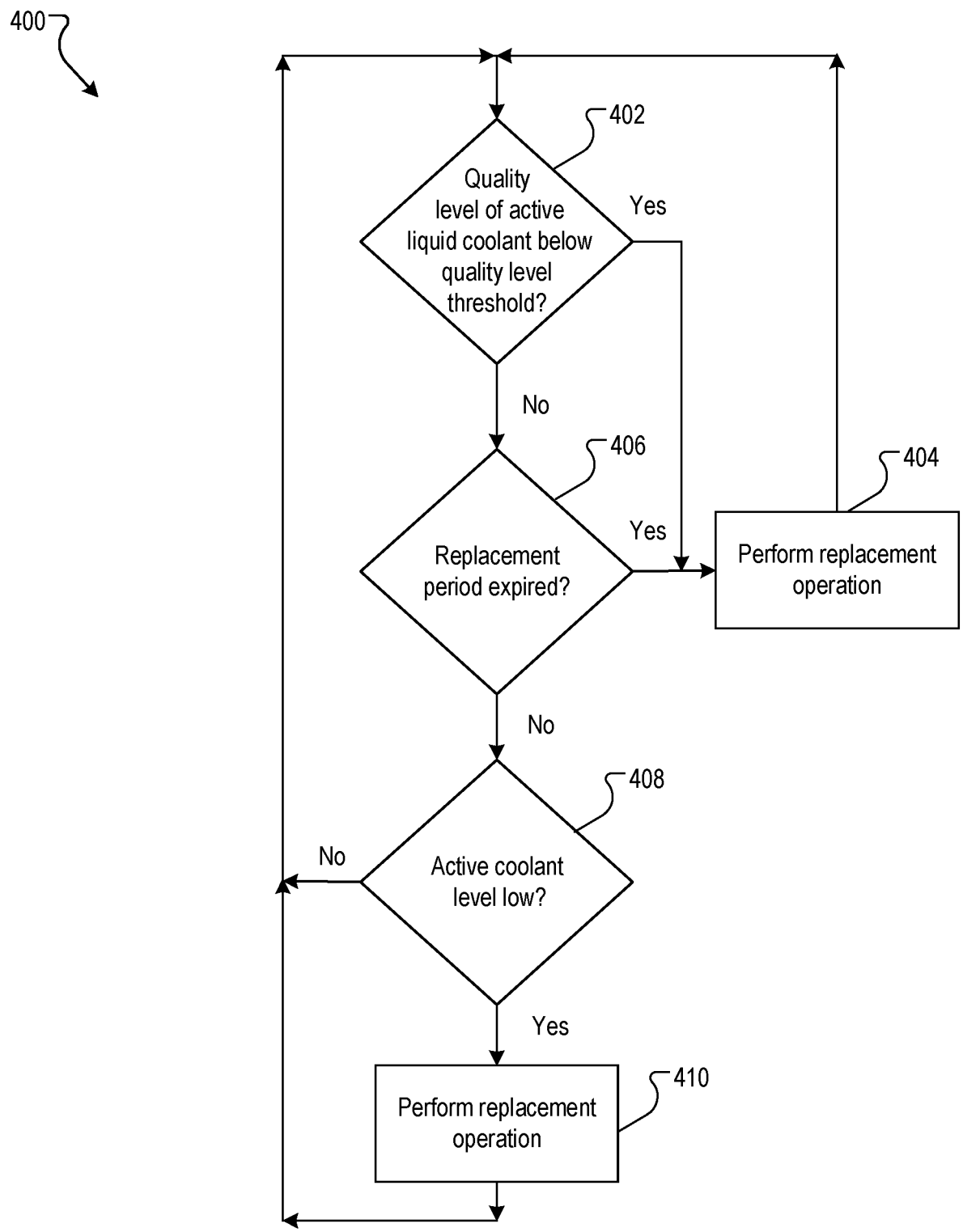
FIG. 4 is a flow diagram of an example process for triggering a replacement operation.

FIG. 4 is a flow diagram of an example process for triggering a replacement operation. The process can be implemented in the system of FIG. 1 or 2 by the controller 110.

The process 400 determines whether a quality level of active liquid coolant is below a quality level threshold (402). As described above, the quality level can be based on a turbidity measurement, a pH measurement, a biologic measurement, a mineral measurement, or other measurements that are indicative of coolant quality. More than one measurement can also be considered.

If the process 400 determines the quality level of active liquid coolant is below the quality level threshold, then the process 400 performs a replacement operation (404). The replacement operation can be as described above.

If the process 400 does not determine the quality level of active liquid coolant is below the quality level threshold, then the process 400 determines whether a replacement period expired (406). For example, a bi-weekly maintenance operation can include replacing a portion of the liquid coolant.

If the process 400 determines the replacement period expired, then the process 400 performs a replacement operation (404). The replacement operation can be as described above.

If the process 400 does not determine the replacement period expired, then process 400 determines whether the active coolant is low (408). If the process 400 determines the active coolant is low, then the process 400 performs a replacement operation (410). The replacement operation 410 may involve only replenishing coolant instead of replacing a portion of active coolant.

After the replacement operation of 410 or 404, or if the process 400 did not determine the active coolant is low, then the process 400 returns to 402.

Figure 5:
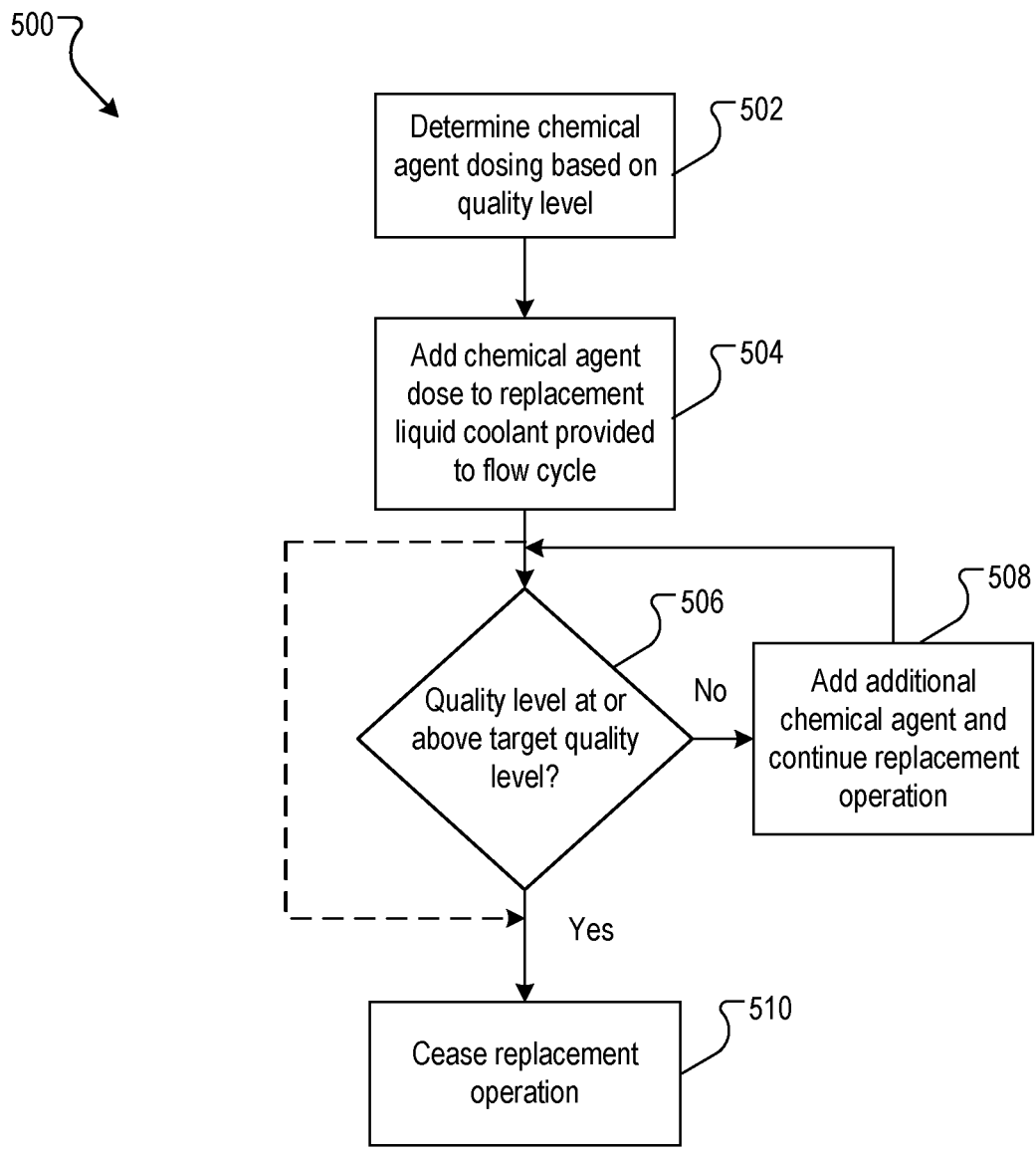
FIG. 5 is a flow diagram of an example process for dosing liquid coolant with a chemical agent.

FIG. 5 is a flow diagram of an example process for dosing liquid coolant with a chemical agent. The process can be implemented in the system of FIG. 1 or 2 by the controller 110.

The process 500 determines a chemical agent dosing based on the coolant quality level (502). As described above, the amount of agent may be fixed, e.g., X mL per every 10 liters of liquid coolant. Alternatively, the amount of agent may depend on the quality level detected, e.g., for each range in various ranges of quality levels, a corresponding amount of agent may be added. In general, the worse the indicated quality level, the greater the amount of agent required. These amounts may be specified, for example, in a look-up table stored in a memory of the controller 110, or may be the result of a dosing amount function executed by the controller 110, where the function receives as input the quality level and the amount of coolant, and calculates the required amount of agent.

More than one agent may be added. For example, a biocide agent and a pH balancing agent may be added, depending on the detected quality levels.

The process 500 adds the chemical agent dose to the replacement liquid coolant provided to flow cycle (504). In some implementations, the process 500 may then cease the replacement operation (510), as indicated by the dashed flow line. In another implementation, the process 500 can monitor the active liquid coolant, e.g., by sensor 158, to determine if whether the quality level is at or above a target quality level (506). For example, after a time period after adding the agent, e.g., an hour, the process 500 can determine how the agent has affected the quality level by causing the senor subsystem to update the detected quality level.

If the process 500 determines the quality level is not at or above a target quality level, then the process 500 adds additional chemical agent and returns to 506 (508). The amount of agent may be less than originally added, or may be an equal amount, or may be based on another function.

If the process 500 determines the quality level is at or above a target quality level, then the process 500 ceases the replacement operation (510). Otherwise, the process 500 may again add additional agent.

Figure 6:
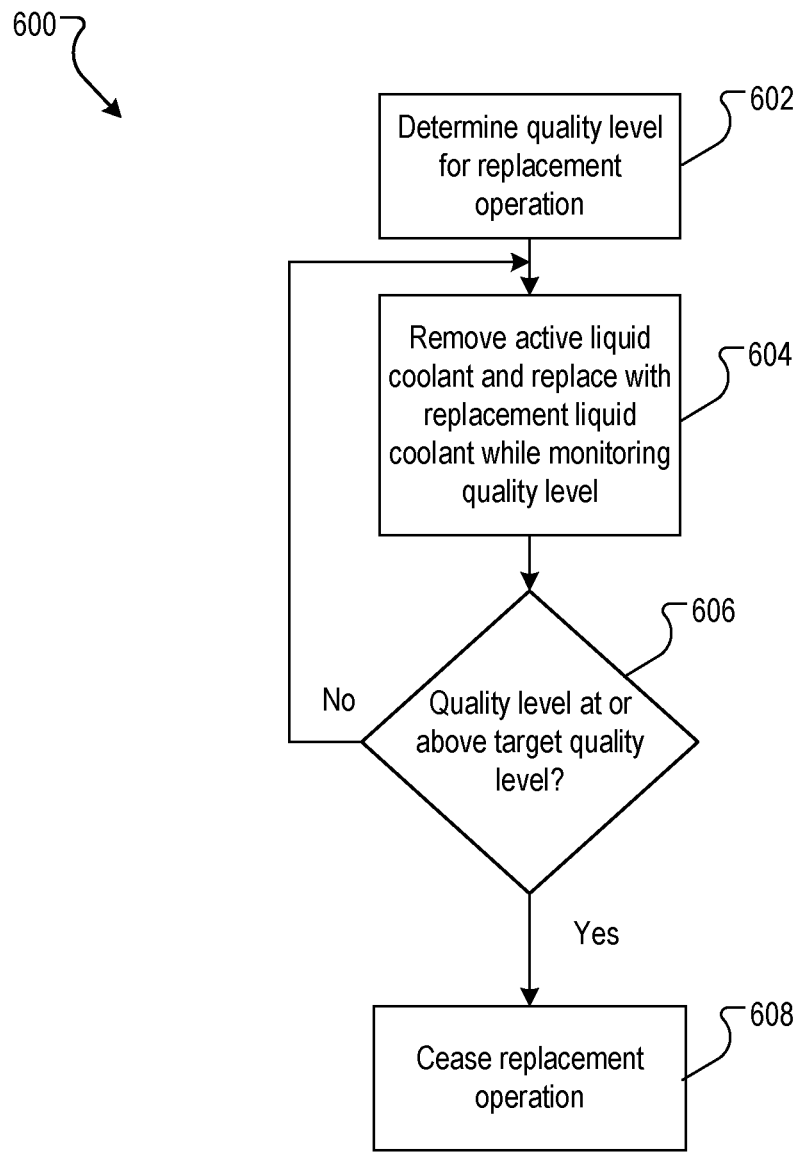
FIG. 6 is a flow diagram of an example process for monitoring a coolant quality level during a replacement operation.

FIG. 6 is a flow diagram of an example process for monitoring a coolant quality level during a replacement operation. The process can be implemented in the system of FIG. 1 or 2 by the controller 110.

The process 600 determines a quality level for a replacement operation (602). The quality level may be determined as described with reference to step 502 above.

The process 600 removes active liquid coolant and replaces it with replacement liquid coolant while monitoring the quality level (604). Here, the quality level is increased by the addition of replacement liquid coolant.

The process 600 determines whether the quality level is at or above a target quality level (606). If the process 600 determines the quality level is not at or above a target quality level, then the process 600 returns to 604, and removes more active liquid coolant and adds additional replacement liquid coolant.

If the process 600 determines the quality level is at or above a target quality level, then the process 500 ceases the replacement operation (608).

Embodiments of the control circuitry and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively, or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A liquid coolant replacement system, comprising:
   a first reservoir for storing replacement liquid coolant, the replacement liquid coolant being liquid coolant that is to replace active liquid coolant in a coolant distribution unit of a coolant system;
   a liquid coupling subsystem through which the replacement liquid coolant is provided into a flow cycle of the active liquid coolant in the coolant distribution unit, and through which the active liquid coolant is received from the flow cycle of the coolant distribution unit;
   a control system coupled to the liquid coupling subsystem and that generates control signals for the liquid coupling subsystem for a replacement operation that causes the liquid coupling subsystem to:
   receive, from the coolant distribution unit, active liquid coolant that is removed from the flow cycle while the coolant distribution unit is operational and providing cooling to an electronic system; and
   provide, from the first reservoir, replacement liquid coolant to the flow cycle while the coolant distribution unit is operational and providing cooling to an electronic system;
   a coolant quality sensor subsystem that determines a quality level of the active liquid coolant and generates data indicating a determined quality of the active liquid coolant; and
   wherein the control system receives, from the coolant quality sensor subsystem, the data indicating a determined quality of the active liquid coolant; and
   when the determined quality of the active liquid coolant is below a first threshold quality level, the control system initiates the replacement operation; and
   wherein during the replacement operation:
   the coolant quality sensor subsystem periodically determines an updated quality level of the active liquid coolant and generates data indicating the determined updated quality of the active liquid coolant; and
   wherein the control system receives, from the coolant quality sensor subsystem, the data indicating the determined updated quality of the active liquid coolant; and
   when the determined update quality of the active liquid coolant exceeds the first threshold quality level, the control system ceases the replacement operation.

2. The liquid coolant replacement system of claim 1, wherein during the replacement operation, the liquid coolant replacement system replaces at least a predetermined amount of active liquid coolant with replacement liquid coolant, wherein the predetermined amount of active liquid coolant is less than an amount of active liquid coolant in the coolant distribution unit before the replacement operation.

3. The liquid coolant replacement system of claim 1, the control system ceases the replacement operation when the determined update quality of the active liquid coolant exceeds a second threshold quality level that is greater than the first threshold quality level.

4. The liquid coolant replacement system of claim 1, wherein the coolant quality sensor subsystem comprises an optical sensor that determines coolant quality based on an optical characteristic of the coolant.

5. The liquid coolant replacement system of claim 1, wherein the coolant quality sensor subsystem comprises a biological sensor that determines coolant quality based on biological characteristic of the coolant.

6. The liquid coolant replacement system of claim 1, further comprising:
   a second reservoir for storing a chemical agent that is added to the replacement liquid coolant provided to the flow cycle during the replacement operation.

7. The liquid coolant replacement system of claim 1, further comprising:
   wherein the control system receives, from the coolant quality sensor subsystem, the data indicating a determined quality of the active liquid coolant; and
   wherein the control system regulates the replacement of active liquid coolant with replacement liquid coolant and the addition of a chemical agent to the replacement liquid coolant based on the determined quality level of the active liquid coolant.

8. The liquid coolant replacement system of claim 1, wherein during the replacement operation, the liquid coolant replacement system replaces the active liquid coolant with replacement liquid coolant at a flow rate that is based on the determined quality level of the active liquid coolant.

9. The liquid coolant replacement system of claim 1, wherein the control system generates the control signals for the liquid coupling subsystem for the replacement operation on a repeating, periodic basis.

10. The liquid coolant replacement system of claim 1, wherein the replacement operation comprises a first replacement operation and a second replacement operation, and wherein the control signals include:
    a first set of control signals that for the first replacement operation that causes the liquid coupling subsystem replace at least a first predetermined amount of active liquid coolant with replacement liquid coolant, wherein the first predetermined amount of active liquid coolant is less than an amount of active liquid coolant in the coolant distribution unit before the first replacement operation; and
    a second set of control signals for the second replacement operation that causes the liquid coupling subsystem replace a second predetermined amount of active liquid coolant with replacement liquid coolant, wherein the second predetermined amount of active liquid coolant is equal to an amount of active liquid coolant in the coolant distribution unit before the second replacement operation.

11. The liquid coolant replacement system of claim 1, wherein:
    the liquid coupling subsystem comprises:
    a first physical flow path that receives active liquid coolant from the flow cycle; and
    a second physical flow path that provides replacement liquid coolant to the flow cycle from the first reservoir; and
    the control system generates control signals that causes the first physical flow path to receive active liquid coolant and the second physical flow path to provide replacement liquid coolant simultaneously and at a substantially equal flow rates.

12. The liquid coolant system of claim 10, wherein:
    the liquid coupling subsystem comprises:

a single physical flow path that selectively receives active liquid coolant from the flow cycle during a first selection, and selectively provides replacement liquid coolant to the flow cycle from the first reservoir during a second selection; and the control system generates control signals that causes the single physical flow path to selectively receive active liquid coolant during a first time period and selectively provide replacement liquid coolant during a second time period.

13. A method of replacing liquid coolant in a cooling distribution unit, comprising:

generating a replacement operation signal;

in response to the replacement operation signal, controlling a liquid coupling system through which replacement liquid coolant is provided into a flow cycle of an active liquid coolant in a coolant distribution unit, and through which active liquid coolant is received from the flow cycle of the coolant distribution unit to perform the operations of:

receiving, from the coolant distribution unit, active liquid coolant that is removed from the flow cycle while the coolant distribution unit is operational and providing cooling to an electronic system; and providing replacement liquid coolant to the flow cycle while the coolant distribution unit is operational and providing cooling to an electronic system;

the operations including:

determining a quality level of the active liquid coolant;

when the determined quality of the active liquid coolant is below a first threshold quality level, initiating the replacement operation; and wherein during the replacement operation:

periodically determining an updated quality level of the active liquid coolant; and when the determined update quality of the active liquid coolant exceeds the first threshold quality level, ceasing the replacement operation.

14. The method of claim 13, further comprising:

adding a chemical agent to the replacement liquid coolant based on the determined quality of the active liquid coolant.

15. The method of claim 13, wherein the operations of receiving, from the coolant distribution unit, active liquid coolant that is removed from the flow cycle while the coolant distribution unit is operational and providing replacement liquid coolant to the flow cycle while the coolant distribution unit is operational are done on a periodic basis.

16. The method of claim 13, wherein:

receiving active liquid coolant that is removed from the flow cycle is done through a first physical flow path; and providing replacement liquid coolant to the flow cycle is done though a second physical flow path that is different from the first physical flow path.

17. The method of claim 13, wherein:

receiving active liquid coolant that is removed from the flow cycle and providing replacement liquid coolant to the flow cycle is done through and a single physical flow path over separate first and second time periods, respectively.

* * * * *